United States Patent
de Leon et al.

(10) Patent No.: US 8,937,524 B2
(45) Date of Patent: Jan. 20, 2015

(54) SOLDERLESS SURFACE MOUNT FUSE

(75) Inventors: Conrado de Leon, Manila (PH);
Gordon T. Dietsch, Park Ridge, IL (US);
Edgardo Olan, Batangas (PH); John Emannuel Semana, Batangas (PH);
John Song, Barrington, IL (US);
Stephen J. Whitney, Lake Zurich, IL (US)

(73) Assignee: Littelfuse, Inc., Chicago, IL (US)

( * ) Notice: Subject to any disclaimer, the term of this patent is extended or adjusted under 35 U.S.C. 154(b) by 625 days.

(21) Appl. No.: 12/410,596

(22) Filed: Mar. 25, 2009

(65) Prior Publication Data

US 2010/0245025 A1 Sep. 30, 2010

(51) Int. Cl.
*H01H 85/46* (2006.01)
*H01H 85/04* (2006.01)
*H01H 85/00* (2006.01)
*H01H 69/02* (2006.01)
*H01H 85/041* (2006.01)
*H01H 85/08* (2006.01)
*H01H 85/055* (2006.01)
*H01H 85/157* (2006.01)
(Continued)

(52) U.S. Cl.
CPC ........... *H01H 85/0418* (2013.01); *H01H 85/08* (2013.01); *H01H 69/02* (2013.01); *H01H 85/055* (2013.01); *H01H 85/157* (2013.01); *H01H 85/165* (2013.01); *H01H 2085/0412* (2013.01); *H01H 2085/0414* (2013.01); *H05K 3/3421* (2013.01)
USPC ........... 337/290; 337/187; 337/159; 337/142; 29/623

(58) Field of Classification Search
CPC ... H01H 85/2005; H01H 85/24; H01H 85/44; H01H 85/046; H01H 85/06; H01H 85/055; H01H 85/08; H01H 85/10; H01H 85/11; H01H 85/36; H01H 85/47; H01H 85/165; H01H 85/20; H01H 85/157; H01H 85/0418; H01H 2085/0414; H01R 13/68; H05K 3/3421
USPC .............. 337/290, 187, 159, 142; 29/623
See application file for complete search history.

(56) References Cited

U.S. PATENT DOCUMENTS 1,861,369 A * 5/1932 Sundt ............................ 337/232
2,773,960 A * 12/1956 Sundt et al. .................... 337/166
(Continued)

FOREIGN PATENT DOCUMENTS

CN 1240050 A 12/1999
CN 1812037 A 8/2006
(Continued)

OTHER PUBLICATIONS

PCT/US2010/028673 International Search Report and Written Opinion, Mailed May 21, 2010, 9 pages.

*Primary Examiner* — Anatoly Vortman
(74) *Attorney, Agent, or Firm* — Kacvinsky Daisak Bluni PLLC (57) ABSTRACT

A surface mount fuse in one embodiment includes an insulative body, first and second conductive and caps attached to the insulative body, each end cap defining an aperture, and a fuse element extending (i) through the insulative body and the apertures and (ii) along outside surfaces of the first and second conductive end caps in such a way that solder used to attach the first and second conductive end caps to an external medium also fastens the fuse element to the first and second end caps.

13 Claims, 6 Drawing Sheets

(51) Int. Cl.
*H01H 85/165* (2006.01)
*H05K 3/34* (2006.01)

(56) References Cited

U.S. PATENT DOCUMENTS

| | | | |
|---|---|---|---|
| 2,913,555 A * | 11/1959 | McAlister | 337/164 |
| 3,460,086 A * | 8/1969 | Fister | 337/202 |
| 3,529,270 A * | 9/1970 | Kozacka | 337/232 |
| 3,721,936 A * | 3/1973 | Belcher | 337/241 |
| 3,777,370 A * | 12/1973 | Wakui | 29/623 |
| 4,085,396 A * | 4/1978 | Augis et al. | 337/290 |
| 4,158,188 A * | 6/1979 | Howard | 337/276 |
| 4,177,444 A * | 12/1979 | Taki | 337/163 |
| 4,189,696 A * | 2/1980 | Beswick et al. | 337/232 |
| 4,205,294 A * | 5/1980 | Jacobs, Jr. | 337/234 |
| 4,272,752 A * | 6/1981 | Jacobs, Jr. | 337/276 |
| 4,308,515 A * | 12/1981 | Rooney et al. | 337/162 |
| 4,329,006 A | 5/1982 | Gale | 439/335 |
| 4,346,362 A * | 8/1982 | Feenan et al. | 337/248 |
| 4,384,266 A * | 5/1983 | Lo | 337/244 |
| 4,511,876 A * | 4/1985 | Urani | 337/244 |
| 4,533,895 A * | 8/1985 | Kowalik et al. | 337/165 |
| 4,540,969 A | 9/1985 | Sugar | |
| 4,562,420 A * | 12/1985 | Kowalik et al. | 337/165 |
| 4,563,666 A * | 1/1986 | Borzoni | 337/252 |
| 4,563,809 A * | 1/1986 | Reeder | 29/623 |
| 4,608,548 A * | 8/1986 | Borzoni | 337/201 |
| 4,656,453 A * | 4/1987 | Reeder | 337/236 |
| 4,703,299 A * | 10/1987 | Vermij | 337/158 |
| 4,755,785 A * | 7/1988 | Bernstein | 337/186 |
| 4,851,806 A * | 7/1989 | Rohrer et al. | 337/231 |
| 4,972,169 A * | 11/1990 | Kalra | 337/163 |
| 5,085,600 A * | 2/1992 | Damron | 439/620.28 |
| RE33,877 E * | 4/1992 | Sappington | 439/831 |
| 5,140,294 A * | 8/1992 | Rohrer et al. | 337/278 |
| 5,198,791 A * | 3/1993 | Shibayama et al. | 337/31 |
| 5,214,406 A * | 5/1993 | Reese et al. | 337/231 |
| 5,235,307 A * | 8/1993 | Oh | 337/228 |
| 5,355,110 A * | 10/1994 | Ruggiero et al. | 337/165 |
| 5,644,281 A * | 7/1997 | Kuriyama | 337/295 |
| 5,648,750 A * | 7/1997 | Yuza et al. | 337/295 |
| 5,670,926 A * | 9/1997 | Ranjan et al. | 337/158 |
| 5,854,583 A * | 12/1998 | Falchetti | 337/290 |
| 5,994,994 A | 11/1999 | Ito et al. | |
| 6,067,004 A * | 5/2000 | Hibayashi et al. | 337/227 |
| 6,147,585 A * | 11/2000 | Kalra et al. | 337/248 |
| 6,191,678 B1 * | 2/2001 | Edwards | 337/163 |
| 6,239,977 B1 * | 5/2001 | Price et al. | 361/737 |
| 6,275,135 B1 * | 8/2001 | Hibayashi et al. | 337/227 |
| 6,448,882 B1 * | 9/2002 | Inaba et al. | 337/227 |
| 6,486,766 B1 * | 11/2002 | Reid et al. | 337/186 |
| 6,552,646 B1 * | 4/2003 | Wong | 337/252 |
| 6,798,330 B2 * | 9/2004 | Arikawa et al. | 337/231 |
| 7,320,171 B2 * | 1/2008 | Jollenbeck et al. | 29/623 |
| 7,659,804 B2 * | 2/2010 | Harris et al. | 337/159 |
| 8,629,749 B2 * | 1/2014 | Chiu | 337/228 |
| 2002/0113684 A1 | 8/2002 | Arikawa et al. | 337/163 |
| 2005/0035841 A1 * | 2/2005 | Kobayashi et al. | 337/157 |
| 2005/0168315 A1 * | 8/2005 | Brown et al. | 337/248 |
| 2006/0119465 A1 | 6/2006 | Dietsch | |
| 2006/0197647 A1 | 9/2006 | Whitney et al. | |
| 2006/0290461 A1 * | 12/2006 | Darr et al. | 337/206 |
| 2007/0132539 A1 | 6/2007 | Richter | |
| 2008/0084267 A1 * | 4/2008 | Jollenbeck et al. | 337/246 |
| 2009/0045906 A1 | 2/2009 | Stanek et al. | |
| 2010/0102920 A1 * | 4/2010 | Stanek et al. | 337/186 |
| 2010/0194519 A1 * | 8/2010 | Harris et al. | 337/227 |

FOREIGN PATENT DOCUMENTS

| | | |
|---|---|---|
| CN | 200956360 Y | 10/2007 |
| JP | 5923144 U | 2/1984 |

* cited by examiner

SOLDERLESS SURFACE MOUNT FUSE

BACKGROUND

One drawback with surface mount fuses is the use of solder to connect the fuse element to the conductive ends of the fuses. First, the soldering step adds cost and complexity to the manufacturing of the fuse. The soldered element is housed within the enclosed fuse, which necessitates a relatively complex sequence of soldering the fuse element to the inside of two conductive end caps and fixing the end caps to an insulative housing. The electrical resistance of the fuse element to two end cap connections can result in undesirable heat rise due to electrical current flow through the fuse. Also, the solder reduces the length of the arc channel and may be accompanied by organic flux, both of which can severely limit the short circuit interrupting capability of the fuse.

A need therefore exists for a fuse that does not require the fuse element to be soldered to the end caps of the fuse.

SUMMARY

The present disclosure sets forth a plurality of embodiments for a solderless surface mount fuse. Each of the embodiments makes use of the fact that the solder used to solder the fuse to printed circuit board doubles in function to also solder or permanently affix the fuse element of the fuse to conductive portions or end caps of the fuse. Such feature is advantageous for at least two reasons. First, the fuse can be manufactured without a soldering step, which saves both material and manufacturing cost, and increases reliability by eliminating an internal soldering step. Second, the solder that is applied when the fuse is soldered to a printed circuit board attaches the fuse element to the conductive portions or end caps of the fuse at the outsides of the end caps, which allows the fuse element to reside within the fuse unsoldered. Removing solder from the inside of the fuse decreases the resistance of the fuse for a given amperage rating, reduces heat rise during normal current-carrying operation, increases the length of the arc channel and eliminates the presence of organic flux, each of which improves the performance of the fuse.

In one embodiment, the fuse includes an insulative housing, which can made for example from ceramic, glass, melamine, glass-epoxy composite or other suitable material. The insulative housing can be round or rectangular (square) in cross section. The housing has a length that generally defines a length of the fuse element inside of the fuse. First and second end caps are affixed to first and second ends of the insulative housing, e.g., via press-fit, by glue and/or crimping.

The end caps are each provided with a slot or aperture. A fuse element is placed within the insulative housing and fitted through the slots or apertures of the end caps, so as to extend to the outsides of the end caps. The fuse element at each end is bent a first time to extend along the outside surface of the end caps and bent a second time upon reaching an edge of the end caps, so as to extend axially outwardly from the fuse, or alternatively so as to extend axially under the end caps towards a center of the fuse.

The fuse element can be a wire but is in one preferred embodiment a flat strip of a single or plated metal. A middle portion of the strip can be notched, punched or otherwise reduced in cross-sectional area to provide a point of high resistance for the element and a likely point of opening for the fuse. A spot or coating of a dissimilar metal can also be formed or placed on the element at a desired location. The spot or coating diffuses into the element when heated by an abnormal current to provide a quicker opening fuse element. This phenomenon results because the two metals are selected such that the alloy produced by the diffusion of one metal into the other has a higher resistance and lower melting temperature than the element itself.

In a second primary embodiment, the fuse includes an insulative fuse body, which is open at first and second ends. The fuse body accepts first and second end caps at the first and second open ends, respectively. The first and second end caps include a flange section that abuts against the first and second housing ends, respectively. The first and second inner end caps also include tube portions that extend inwardly into the housing from the flange sections. The flange sections are formed with apertures that are sized to be at least substantially the same as an inner diameter of the tube portions, such that access to the inside of the tube portions can be obtained from the outside of the first and second inner end caps. To this end, the tube portions of the inner end caps have, in one embodiment, an outer diameter that is slightly less than an inner diameter of the insulative housing.

The fuse of the second primary embodiment also includes first and second outer end caps. The outer end caps each include an inwardly facing enclosed, tubular projection that has an outer diameter that fits snugly inside the apertures of the flange sections of the inner end cap and the inside diameter of the tube positions of the inner end caps. The outer end caps also each include a radially outwardly and axially inwardly facing tubular flange that seals to, e.g., press-fits over, one of the ends of the insulative housing. The outer end caps are enclosed and seal the first and second open ends of the insulative housing.

The fuse of the second primary embodiment also includes a fuse element, which can be a straight wire, a wound wire or a flat strip. In any case, the fuse element is crimped at each of two ends between the mating inner and outer end caps, so as to form solderless permanent conductive connections between the fuse element and the mated inner and outer end caps. The overall fuse is then soldered, via the first and second outer end caps to a printed circuit board, for example.

In a third primary embodiment, the fuse employs a glass housing having its ends sealed around the fuse element by a thermal method, such as via flame contact, infrared heating or induction heating. The end portions are then coated with a thin layer of metallic material such as silver or copper in such a way that the element is at least partially crimped or fixed to the ends prior to soldering the fuse to a printed circuit board.

The operation of soldering the metallized ends and the fuse for operation, e.g., to a printed circuit board, also serves to secure the fuse element (wire or flat strip) to the metallized ends. Here again, the fuse can be manufactured and installed for use without internal soldering. Also, because there is no internal solder or organic flux, the length of the arc channel is maximized for a given fuse length and arc suppression is enhanced, increasing the fault interruption capability. Also, the overall resistance of the fuse is reduced, resulting in less heat rise in normal current-carrying operation.

In a fourth primary embodiment, each of the end caps is formed with an aperture. The fuse element is formed via a flat strip of metal, metal alloy or plated metal. The element is bent at least one time at each of its ends, forming first and second end contacting surfaces. The first and second end contacting surfaces are mated with inside surfaces of the end caps when the fuse element is placed within an insulative housing and the end caps are affixed to the housing. The fuse element strip is wide enough to cover the entire aperture of the end caps, such that the first contacting surface covers the aperture of the first end cap and the second contacting surface covers the aperture of the second end cap.

Upon the mounting the fuse of the fourth primary embodiment, e.g., to a printed circuit board, the solder used to secure the fuse also flows up along the outside surfaces of the end caps and into the apertures of the end caps, securing the first and second contacting surfaces of the element to the first and second end caps, respectively, so as to further secure the fuse element to the fuse of the fourth primary embodiment. Again, no internal solder is needed, the effective length of the first arc channel is increased and the overall electrical resistance is reduced.

It is accordingly an advantage of the present disclosure to reduce material cost for surface mount fuses.

It is another advantage of the present disclosure to reduce manufacturing cost for surface mount fuses.

It is a further advantage of the present disclosure to reduce manufacturing complexity for surface mount fuses.

It is still another advantage of the present disclosure to increase the effective length of the arc channel for a given housing length.

It is still a further advantage of the present disclosure to provide an improved interrupting fuse by effectively eliminating solder from the inside of the fuse, which can degrade the fuse's ability to interrupt the electrical arc that forms during the interruption process.

It is yet another advantage of the present disclosure to provide a lower resistance fuse, which generates less heat rise during normal current-carrying operation.

Additional features and advantages are described herein, and will be apparent from the following Detailed Description and the figures.

DETAILED DESCRIPTION

Referring now to the drawings and in particular to FIGS. 1 to 4, a first primary embodiment of a solderless surface mount fuse is illustrated by fuse 10. Fuse 10 includes a ceramic body 12, which is made of an insulative material, such as ceramic, glass, melamine or glass-epoxy composite. Insulative body 12 is made of a material that is capable of withstanding heating due to the soldering of solderless fuse 10 to a printed circuit board ("PCB") 14. End caps 16a and 16b are force or press-fitted onto first and second ends of housing 12 forming a fuse having a circular, square or rectangular cross-section. End caps 16a and 16b define holes or slots 18a and 18b, respectively, which allow a fuse element 20 to be inserted into and through insulative housing 12. End caps 16a and 16b are made additionally or alternatively of a conductive material, such as copper, nickel, silver or brass. End caps 16a and 16b can be made of a metal alloy and/or can be plated, such as being made of a silver, gold or tin plated copper.

Figure 1:
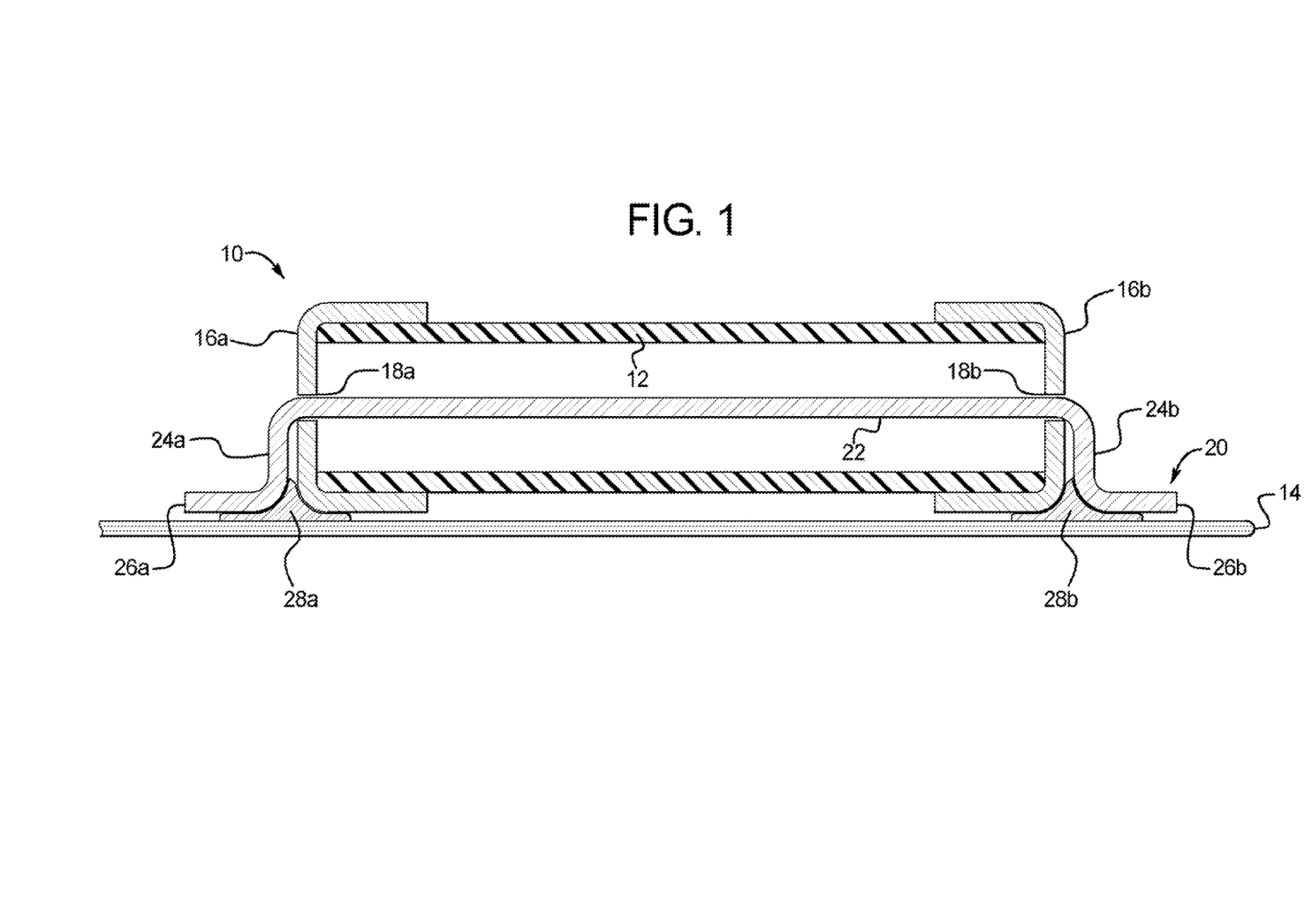
FIG. 1 is an elevation sectioned view of a first primary embodiment of a solderless surface mount fuse of the present disclosure in a mounted condition.

Fuse element 20 includes a horizontal section 22 that extends through the interior of insulative housing 12 and through holes or slots 18a and 18b of end caps 16a and 16b. First sections 24a and 24b of fuse element 20 are bent as illustrated so as to extend along the outer wall of respective end caps 16a and 16b. Second bent sections 26a and 26b are bent from first bent sections 24a and 24b, respectively, so as to extend along the surface of PCB 14. Alternatively, sections 26a and 26b may be bent in the opposite direction (not illustrated), so as to extend along the surface of PCB 14 under the end caps 16a and 16b, towards a center of fuse 10.

FIG. 1 shows surface mount fuse 10 soldered to PCB 14 via solder joints 28a and 28b. Solder joints 28a and 28b connect respectively to a portion of end caps 16a and 16b as well as to secondary bent surfaces 26a and 26b of fuse element 20. Solder joints 28a and 28b also "wick up" between first bent surfaces 24a and 24b of fuse element 20 and the outside, opposing surfaces of respective end caps 16a and 16b. Solder joints 28a and 28b therefore serve the dual purposes of securing fuse 10 to PCB 14 and of securing fuse element 20 to end caps 16a and 16b.

It should be appreciated that until fuse 10 is soldered to PCB 14, no solder is used to secure fuse element 20 to end caps 16a and 16b. Instead, the bending of sections 24a and 24b at the extension of fuse element 20 through apertures 18a and 18b holds the fuse element 20 at least loosely in place. The elimination of solder needed to manufacture fuse 10 reduces cost, manufacturing complexity and the potential for improperly produced pieces. Also, because no solder resides on the inside of housing 12 and end caps 16a and 16b, the effective arc channel length is increased. And because there is no organic flux is needed inside of fuse 10, arc quenching is enhanced. The result is a more effective fuse per package size.

Figure 2:
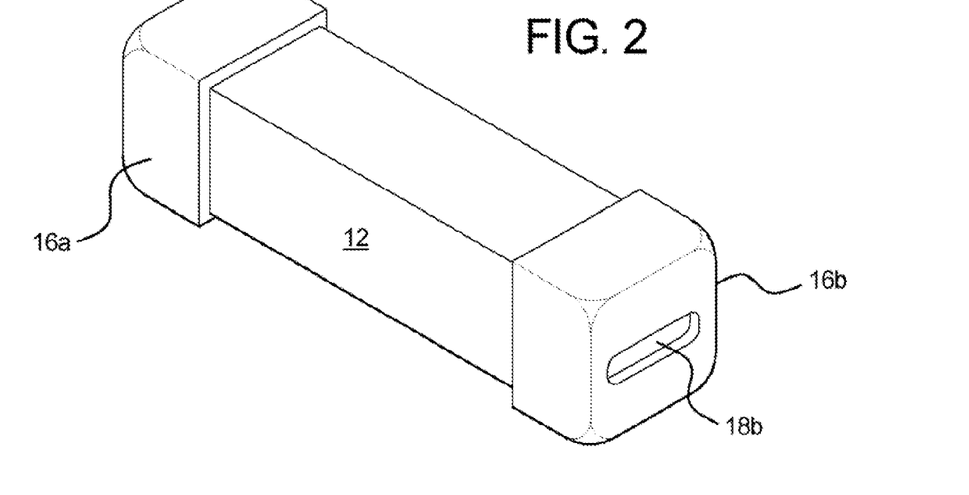
FIG. 2 is a perspective view of the outside of the solderless surface mount fuse of FIG. 1 with the fuse element removed.

FIG. 2 illustrates fuse 10 prior to the insertion of fuse element 20. Both apertures (only aperture 18b seen) are in the form of a slot, which accepts fuse element 20, which is in the form of a strip. Alternatively, apertures 18a and 18b are holes that accept a round or wire-type fuse element. In a preferred embodiment, regardless of the shape of apertures 18a and 18b, the apertures are sized to allow fuse 20 to pass through the apertures in a snug, slightly frictionally engaging manner.

Figure 3:
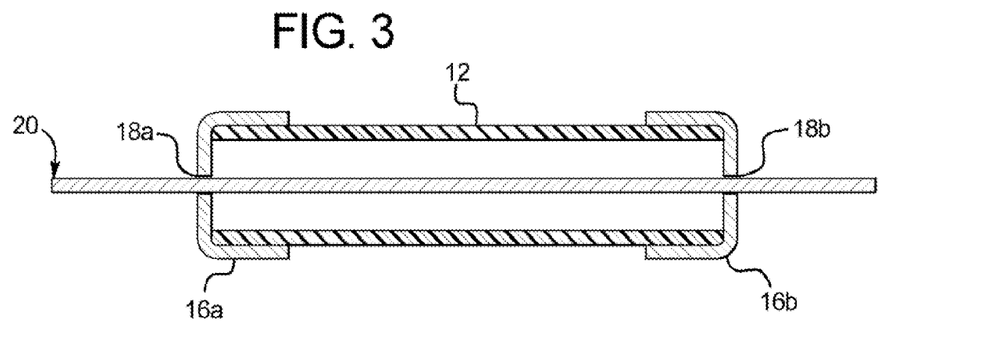
FIGS. 3 and 4 are elevation section views of the solderless surface mount fuse of FIG. 1 at different stages of manufacturing.

FIG. 3 shows fuse 10 in one stage of manufacturer, in which fuse element 20 has been slid through apertures 18a and 18b. Fuse element 20 in a flat condition is sized to allow for bended sections 24a, 24b, 26a and 26b.

Figure 4:
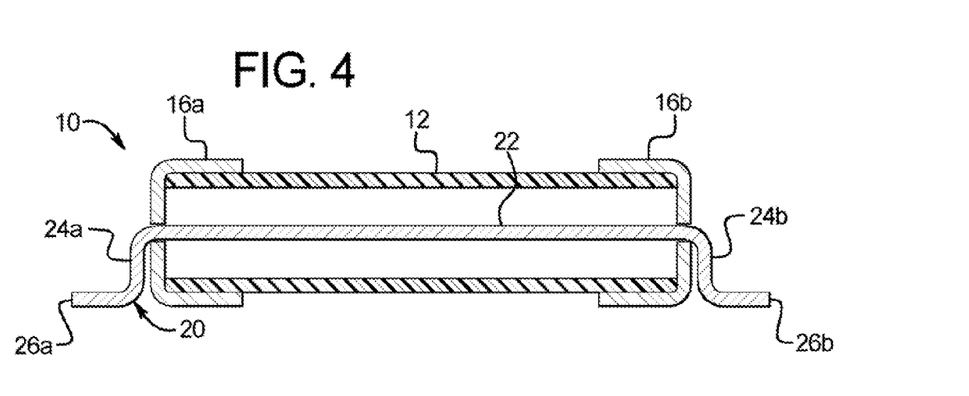

FIG. 4 shows fuse 10 in a completed state. Again, no solder is applied to finish fuse 10. Solder is not present until fuse 10 is soldered in place for application, e.g., to PCB 14, which is typically printed with a solder paste, onto which fuse 10 is placed and reflowed.

Figure 5:
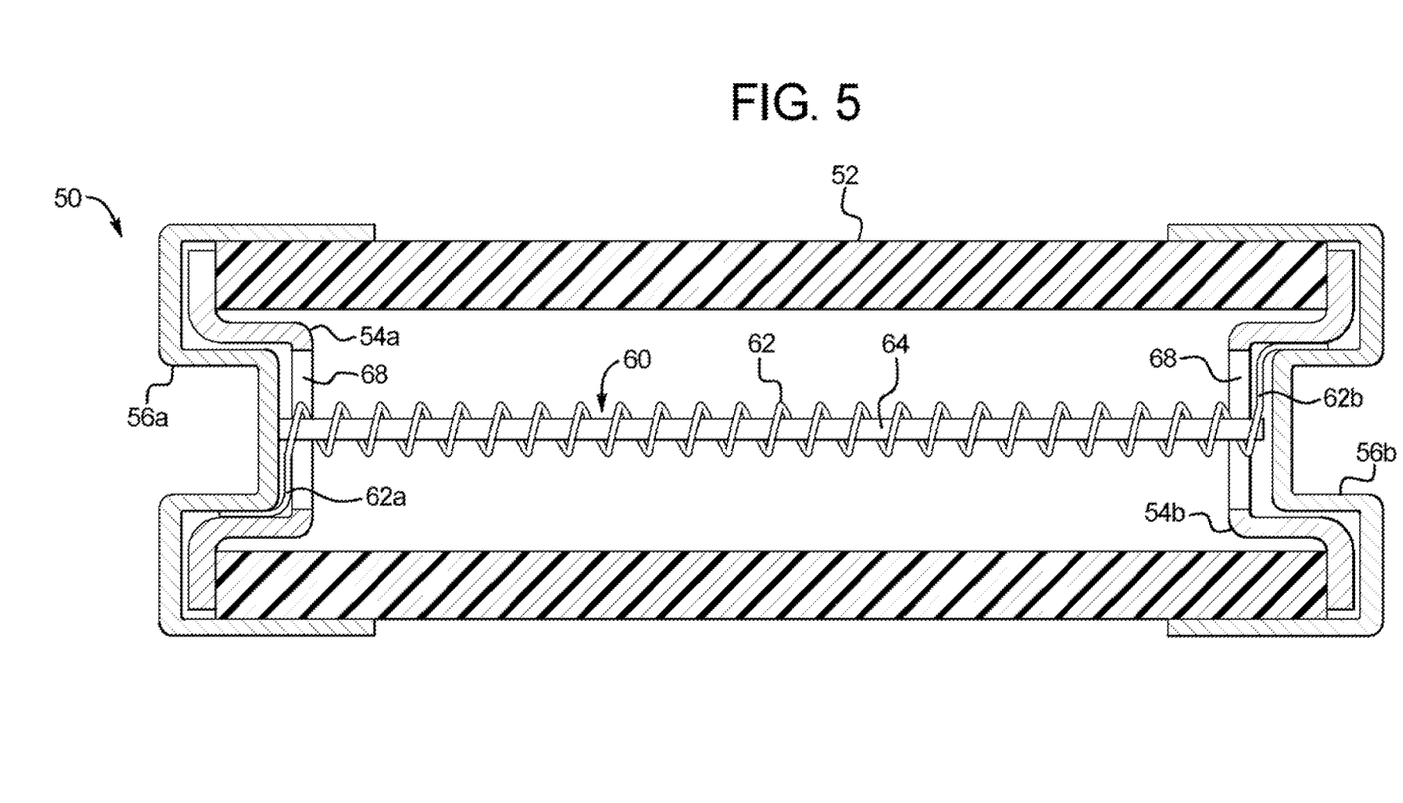
FIG. 5 is an elevation section view of a second primary embodiment of a solderless surface mount fuse of the present disclosure.

Referring now to FIGS. 5, 6A, 6B, 7A and 7B, a second primary embodiment of a solderless surface mount fuse is illustrated by fuse 50. As seen in FIG. 5, fuse 50 includes an insulative housing 52, which can be made of any of the materials discussed above for housing 12. First and second inner end caps 54a and 54b are inserted into first and second respective ends of insulative housing 52. First and second outer end caps 56a and 56b are then forced fitted over the cylindrical, square or rectangular outside of insulative housing 52. In this manner, outer end caps 56a and 56b, when secured frictionally to housing 52, also press inner end caps 54a and 54b into place fixedly. Inner end caps 54a and 54b and outer end caps 56a and 56b can be made of any of the materials and material combinations discussed above for end caps 16a and 16b.

Inner end caps 54a and 54b each define an aperture 68 that allows a fuse element 60 to extend through the aperture and thus through inner end caps 54a and 54b. Fuse element 60 in the illustrated embodiment includes a wire 62 that is wound about an insulative post 64, which can be made of glass or ceramic yarn. Alternatively, wire 62 can be wound around another conductive wire (in place of post 64) of different diameter, composition and resistance. Wire 62 and the inner wire (in place of post 64) can be made of copper, silver or an alloy, or may be a plated wire such as silver or tin-plated copper. Wire 62 includes first and second ends 62a and 62b that are crimped between mating inner and outer end cap pairs 54a, 56a and 54b and 56b, respectively and diagonally in the illustrated embodiment. In the above-illustrated manner, wire 62 and thus element 60 are held in place and conductively coupled to the end cap pairs without the use of internal solder.

Figure 6A:
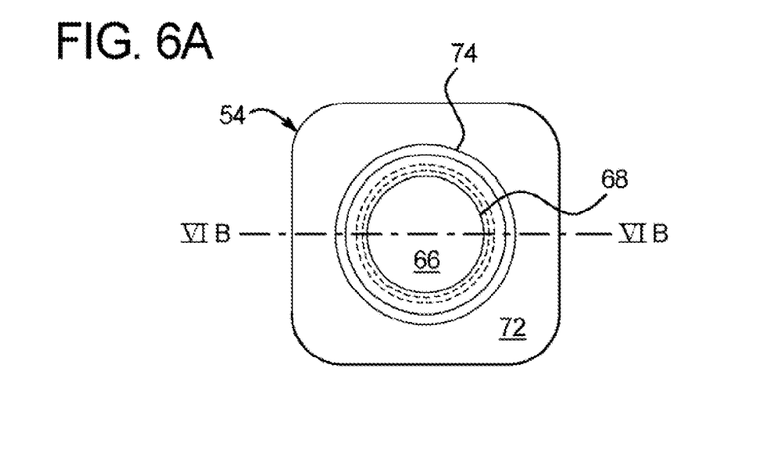
FIG. 6A is a top view of one embodiment of an inner end cap used with the solderless surface mount fuse of FIG. 5.
Figure 6B:
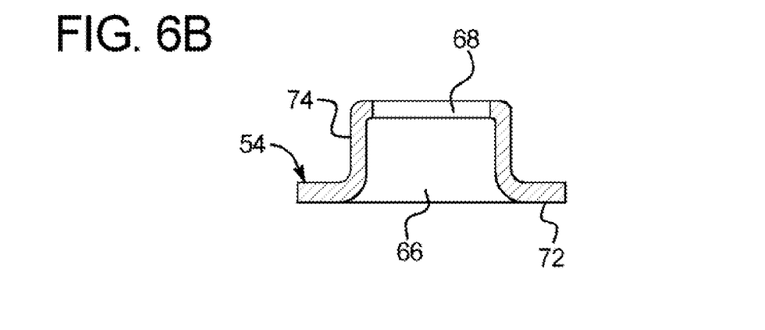
FIG. 6B is an elevation sectioned view of the inner end cap embodiment taken along line VIB-VIB of FIG. 6A.

FIGS. 6A and 6B illustrate inner end cap 54 (referring to both end caps 54a and 54b) in more detail. As illustrated, inner end cap 54 defines two openings, an outer opening 66 and an inner opening 68 disclosed above. Inner end cap 54 has a flange section 72 and a projection 74 extending from flange 72. Flange 72 in the illustrated embodiment is square but could alternatively be circular or rectangular. Projection 74 in the illustrated embodiment is cylindrical but could alternatively be square or rectangular in shape. The top of projection 74 defines inner aperture 68, through which fuse element 60 extends. The inner diameter of projection defines outer aperature 66, through which outer end cap 56 extends.

Figure 7A:
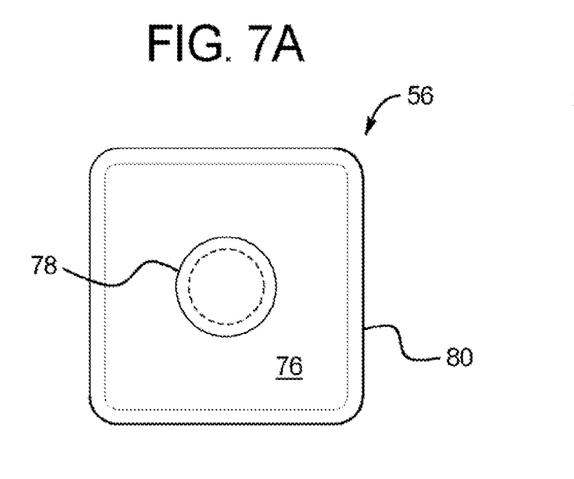
FIG. 7A is a top view of one embodiment of an outer end cap used with the solderless surface mount fuse of FIG. 5.
Figure 7B:
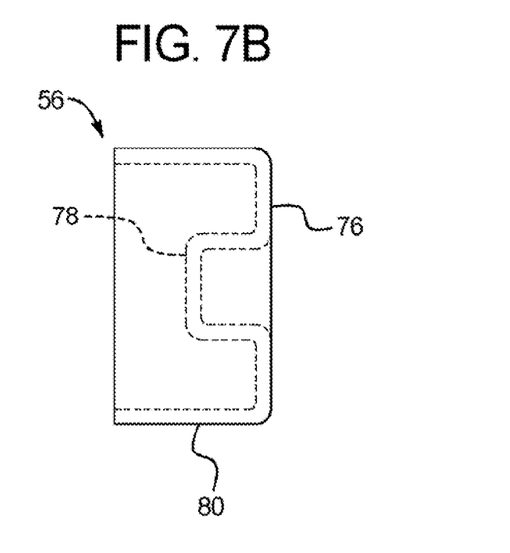
FIG. 7B is a side view of the outer end cap of FIG. 7A.

FIGS. 7A and 7B illustrate outer end cap 56 (referring to end caps 56a and 56b) in more detail. Outer end cap 56 includes a base 76 from which a central projection 78 and an outer wall 80 extend. Projection 78 is closed so that the inside of fuse 50 is sealed from the environment. Projection 78 is cylindrical or annular as illustrated, but alternatively has a square or rectangular shape. Outer wall 80 is square in the illustrated embodiment but is alternatively cylindrical or rectangular. The inner diameter of outer wall 80 is sized to fit in a force or pressure-fit manner about the outer diameter of housing 52. The outer diameter of flange 72 of inner end cap 54 is square in the illustrated embodiment but is alternatively circular or rectangular. The diameter of flange 72 is sized so as to cover substantially all of the contacting face of edge of insulative housing 52.

The outer diameter of projection 78 is sized to fit snugly within the inner diameter of aperture 66, such that the mating end caps 54 and 56 can adequately squeeze wire ends 62a and 62b into a locking-type frictional holding engagement, which in turn holds fuse element 60 firmly within fuse 50. In one example, the inner diameter of projection 74 is about 1.2 inches, while the outer diameter of rejection 78 of outer end cap 56 is about 1.13 inches.

Fuse 50 as illustrated requires no internal solder. The pressure fitting of the end cap pairs is relatively easy to assemble. Resulting fuse 50 does not have mounting apertures extending outwardly from outer end caps 56a and 56b, providing a relatively small overall footprint.

Figures 8A, 8B:
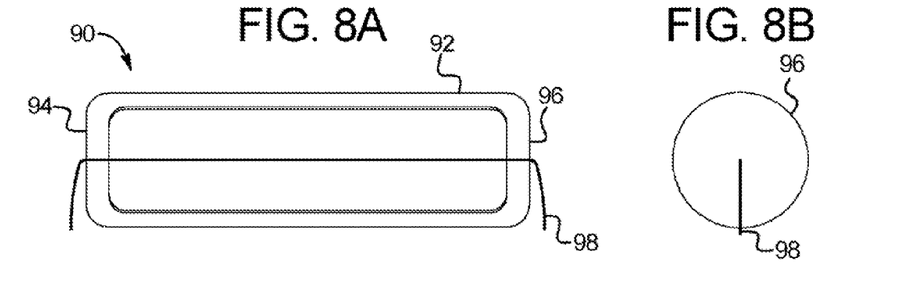
FIGS. 8A and 8B are elevation and end views, respectively, of a third primary solderless surface mount fuse embodiment of the present disclosure, which uses a glass tube housing.

Referring now to FIGS. 8A and 8B, yet another primary embodiment of a solderless surface mount fuse of the present disclosure is illustrated by fuse 90. Fuse 90 includes a glass body having a length 92 and end walls 94 and 96. A fuse element 98, such as a wire element, is held in place during the manufacturer of glass housing 92, 94, 96, so that the element is fixed in place by thermally collapsing or sealing the end walls onto the element. Length 92 of the glass body can have foot portions (not illustrated) that balance fuse 90 while the fuse is being soldering to a PCB. Alternatively, glass body length 92 has a square or rectangular cross-section that allows fuse 90 to be placed onto a PCB without rolling or moving. Fuse 90 is advantageous in one respect because the fuse is relative simply in construction and makes efficient use of the length of fuse element 98 within the housing. Again, the fuse is manufactured without the use of internal solder.

Referring now to FIGS. 9A to 9E, yet a further primary embodiment of a solderless surface mount fuse of the present disclosure is illustrated by fuse 100. Fuse 100 is similar to fuse 90 in that it includes a glass housing 102. Fuse 100, on the other hand, includes metallized end walls 104 and 106, which can be made of any of the conductive materials and material combinations discussed above for the end caps of the other primary embodiments. Metallized end walls 104 and 106 are deposited onto glass body 102 via a process, such as dipping, transfer printing, sputtering or evaporation. Fuse element 108 is held in place during this metallization process, so that the fuse element is fixed in place with the formation of metallized end walls 104 and 106.

Figure 9A:
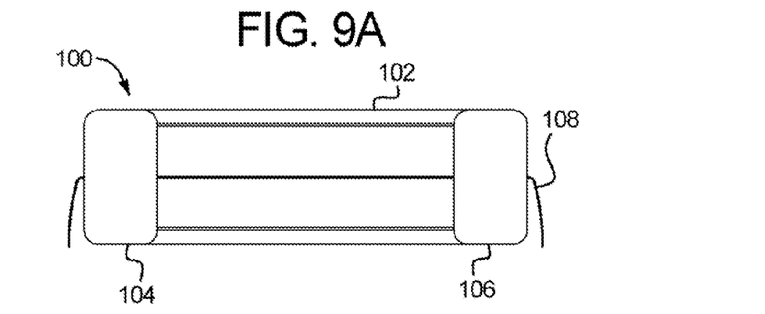
FIG. 9A is an elevation view of another glass tube, third primary solderless surface mount fuse embodiment of the present disclosure.
Figure 9B:
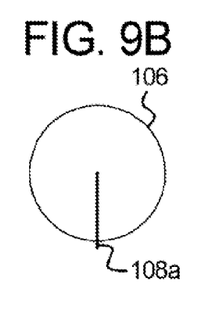
FIG. 9B to 9D illustrate different end views showing different variations of the glass tube, solderless surface mount fuse embodiment of FIG. 9A.
Figure 9C:
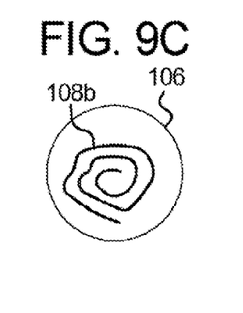
Figure 9D:
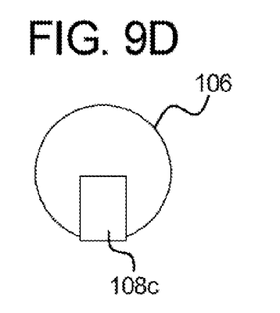

FIGS. 9B to 9D illustrate three different varieties of fuse elements, 108a to 108c (referred to herein collectively as fuse element 108). Fuse element 108a is a simple wire element, which can be solid or stranded. Fuse element 108b can be of the same material as fuse element 108a, but is coiled on the outside of fuse 100 to provided extra length for attachment to a PCB. The metallized end caps 106 also allow fuse element 108 to be in the form of a strip as seen by fuse element 108c shown in connection with FIG. 9D.

Figure 9E:
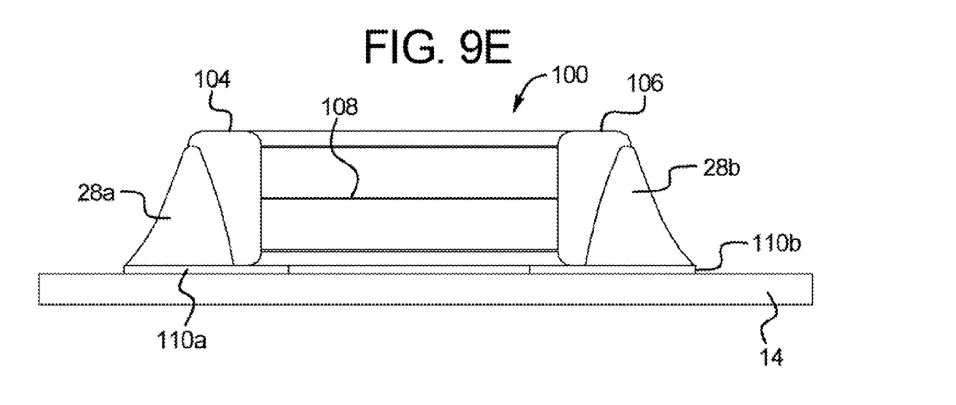
FIG. 9E illustrates the fuse according to any of the variations of FIGS. 9A to 9D in a mounted condition.

FIG. 9E illustrates fuse 100 mounted to a PCB 14, and in particular to pads 110a and 110b of PCB 14. Solder joints 28a and 28b as discussed above in connection with FIG. 1 not only solder fuse 100 to conductive pads 110a and 110b, respectively, the solder joints also help to secure fuse element 108 (which can be any of the fuse elements 108a to 108c) to end caps 104 and 106. Thus, one advantage of fuse 100 verses fuse 90 is that the process of soldering fuse 100 to PCB 14 helps to secure the fuse element to the fuse body or fuse end caps. Fuse 100 shares the efficiency advantages of fuse 90 and of the other fuses described herein, does not require internal soldering and is relatively simple in construction.

Figure 10A:
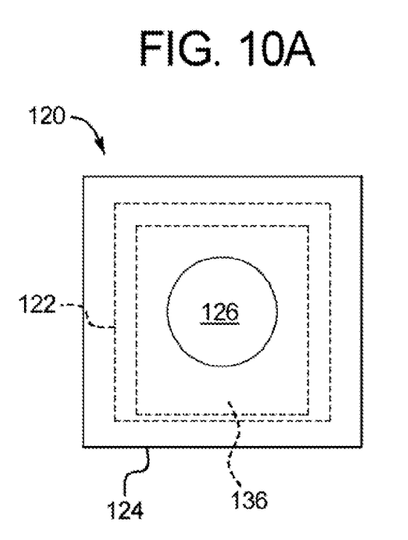
FIGS. 10A and 10B are elevation section and end views, respectively, of a fourth primary embodiment of a solderless surface mount fuse of the present disclosure.
Figure 10B:
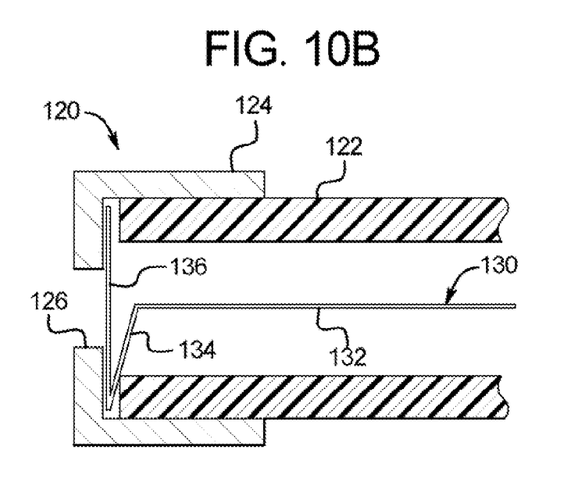
Figure 10C:
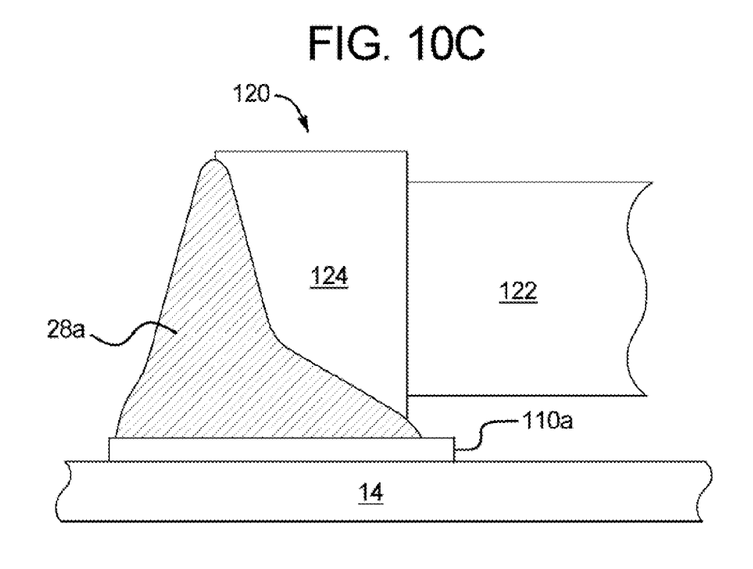
FIG. 10C is an elevation view of an end section of the fourth primary shown in a mounted condition.

Referring now to FIGS. 10A to 10C, still another primary embodiment of the solderless surface mount fuse of the present disclosure is illustrated by fuse 120. Fuse 120 includes an insulative housing 122, which can be made of any of the insulating housing materials discussed herein. Housing 122 and fuse 120 are square in the illustrated embodiment but could alternatively be round or rectangular. A first end cap 124 is secured frictionally to a first end of housing 122. A second end cap (not illustrated) is secured to a second end (not illustrated) of housing 122. The end caps are made of any of the materials described herein. End cap 124 as illustrated defines a circular, square or other suitably shaped aperture 126. The purpose of aperture 126 is discussed below in connection with FIG. 10C.

A fuse element 130 is secured solderlessly between the end caps 124 and housing 122. Fuse element 130 includes a main, horizontal length 132, which extends within the majority of housing 122. A first portion 134 of element 130 is bent at each end of fuse element length 132. A second portion 136 of fuse element 130 is bent at the distill end of each bent portion 134. Fuse element 130, or at least the second bent portions 136 of the element, has a width that is in one preferred embodiment larger than a diameter or width of aperture 126. In this manner, second bent portions 136 completely cover apertures 126 defined by the end caps 124.

As end cap 124 is forced over insulative housing 122, first bent portion 134 is compressed against second bent portion 136, tending to pull the length 132 of fuse element 130 taught. The initial angle between bent sections 134 and 136 can be about thirty degrees or less. Second bent portion 136 is bent such that it is at least substantially perpendicular to horizontal length 132 of element 130. Second bent portion 136 could be bent alternatively such that it extends greater than 90 degrees from horizontal portion, such that the frictional or pressfitting of end cap 124 over insulative body 122 causes second bent portion 136 to be rotated to a right angle relative to horizontal length 132 of fuse element 130. The frictional or force-pressing of end caps 124 onto insulative housing 122 causes inner surface of end caps 124 to abut the ends of housing 122, so that end caps 24 have good electrical continuity with fuse element 130.

Referring now to FIG. 10C, it should be appreciated that the soldering of fuse 120 to mounting pads 110a and 110b of PCB 14 also helps to ensure that end caps 124 are connected electrically to fuse element 130. As illustrated, solder joint 28a flows up onto the end cap 124, flowing through hole or aperture 126 to contact and secure to second bent portion 136 of fuse element 130. Thus, solder joint 28a (and the non-illustrated solder joint) performs two functions: (i) fixing fuse 120 to PCB 14 and (ii) helping to make an even more robust electrical connection between fuse element 130 and the end caps.

In any of the embodiments discussed above, it is contemplated to dip the outside of each end cap in solder or hot tin to assure proper wetting by the solder used to attach the resulting fuse to the printed circuit board ("PCB"). Such solder would not reach the inside of the fuse housing and thus would not prevent the advantages described herein for the (internally) solderless fuses.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A surface mount fuse comprising:
   an insulative body;
   first and second conductive end caps attached to the insulative body, each end cap defining an aperture that extends through a wall of the end cap; and
   a fuse element having a horizontal section extending through the insulative body and the apertures, the fuse element further including first bent sections connected to opposite ends of the horizontal section, the first bent sections extending from the apertures along an outer surface of the first and second conductive end caps to a bottom surface of the first and second conductive end caps, the fuse element further including second bent sections connected to the first bent sections, the second bent sections being parallel to the horizontal section and configured to attach the fuse element to pads on a printed circuit board, wherein the fuse element is secured in the insulative body and the first and second conductive end caps are secured to the insulative body by the first bent sections.

2. The surface mount fuse of claim 1, wherein the fuse element is one of a wire and a strip.

3. The surface mount fuse of claim 1, wherein the insulative housing is made of one of ceramic and glass, melamine or glass-epoxy composite.

4. The surface mount fuse of claim 1, wherein the second bent sections extend away from the first and second conductive end caps and the insulative body.

5. The surface mount fuse of claim 1, wherein solder used to attach the second bent sections to the pads on the printed circuit board also attached the first bent sections to the first and second conductive end caps.

6. A method of manufacturing a surface mount fuse comprising:
   attaching first and second end caps to an insulative body, each of said first and second end caps defining an aperture that extends through a wall of the first and second end caps;
   inserting a fuse element into the insulative body such that portions of the fuse element extend through the apertures, the portion of the fuse element in the insulative body being disposed in a first plane;
   bending the portions of the fuse element that extend out of the apertures at a point near an outer surface of the first and second end caps to form first bent sections of the fuse element that extend along an outer surface of the first and second end caps; and
   bending portions of the first bent sections of the fuse element at a point near a bottom surface of the first and second end caps to form second bent sections of the fuse element that extend in the first plane parallel to the portion of the fuse element in the insulative body, the second bent sections configured to attach the fuse element to pads on a printed circuit board,
   wherein the fuse element is secured in the insulative body and the first and second end caps are secured to the insulative body by the first bent sections.

7. The method of claim 6, wherein the fuse element is inserted into the insulative body before the first and second end caps are secured to the insulative body.

8. The method of claim 6, further comprising crimping the fuse element between the insulative housing and the first and second conductive end caps.

9. The method of claim 6, wherein the fuse element is one of a wire and a strip.

10. The method of claim 6, wherein the insulative housing is made of one of ceramic and glass, melamine and glass-epoxy composite.

11. A surface mount fuse manufactured according to the method of claim 6.

12. The method of claim 6, wherein the second bent sections extend away from the first and second conductive end caps and the insulative body.

13. The method of claim 6, wherein solder used to attach the second bent sections to the pads on the printed circuit board also attached the first bent sections to the first and second conductive end caps.

* * * * *